(12) United States Patent
Reichelt et al.

(10) Patent No.: US 9,240,794 B2
(45) Date of Patent: Jan. 19, 2016

(54) APPARATUS AND METHODS FOR PHASE-LOCKED LOOP STARTUP OPERATION

(71) Applicant: Silicon Laboratories, Inc., Austin, TX (US)

(72) Inventors: Pål Øyvind Reichelt, Sandvika (NO); Øyvind Janbu, Oslo (NO)

(73) Assignee: Silicon Laboratories, Inc, Austin, TX (US)

( * ) Notice: Subject to any disclaimer, the term of this patent is extended or adjusted under 35 U.S.C. 154(b) by 113 days.

(21) Appl. No.: 14/169,766

(22) Filed: Jan. 31, 2014

(65) Prior Publication Data

US 2015/0222275 A1 Aug. 6, 2015

(51) Int. Cl.
*H03L 7/00* (2006.01)
*H03L 7/08* (2006.01)
*H03L 7/099* (2006.01)
*H03L 7/087* (2006.01)

(52) U.S. Cl.
CPC .............. *H03L 7/0802* (2013.01); *H03L 7/087* (2013.01); *H03L 7/099* (2013.01)

(58) Field of Classification Search
CPC ...................................................... H03L 7/0802
See application file for complete search history.

(56) References Cited

U.S. PATENT DOCUMENTS 6,563,387 B2 * 5/2003 Hirano et al. .................... 331/11

* cited by examiner

*Primary Examiner* — Daniel Puentes
(74) *Attorney, Agent, or Firm* — Miller, Matthias & Hull LLP

(57) ABSTRACT

A phase-locked loop (PLL) is provided. The PLL may include a local oscillator configured to generate an output signal, a feedback divider configured to generate a feedback signal in response to the output signal, a phase detector configured to operate the local oscillator based on a comparison between a reference signal and the feedback signal, and a reset controller in communication with each of the phase detector and the feedback divider. The reset controller may be configured to hold each of the phase detector and the frequency divider in reset, and enable each of the phase detector and the frequency divider such that at least the feedback signal is in substantial synchronization with the reference signal.

20 Claims, 2 Drawing Sheets

APPARATUS AND METHODS FOR PHASE-LOCKED LOOP STARTUP OPERATION

TECHNICAL FIELD

The present disclosure relates generally to phase-locked loops (PLLs) and, more particularly, to startup operation of PLLs.

BACKGROUND

Phase-locked loop circuits are commonly used in applications that rely on stable and programmable output frequencies. A typical PLL may be provided in conjunction with a voltage-controlled oscillator (VCO) to produce a desired output frequency that is phase-locked to a reference frequency from a local oscillator, for example. More specifically, a PLL may include a feedback divider for generating an output frequency as a function of programmable ratios and the VCO output, and a phase detector for monitoring phase differences between the reference frequency and the divided output frequency. In addition, a PLL may include a charge pump for generating a signal that is proportional to the phase difference assessed by the phase detector. In response to the charge pump signal, a loop filter of the PLL can be used to output the appropriate voltage or current to adjust the VCO and the output frequency thereof to match the phase of the reference frequency.

Due to the initially arbitrary phase-offset, there are certain delays inherently associated with the phase-matching processes of conventional PLL circuits. Upon startup, for instance, the PLL can incur at least some delay while assessing the phase offset and reducing the offset over one or more cycles. Such delays can adversely affect not only the overall performance of the PLL, but may also contribute to the collective delays associated with other devices relying on the accuracy of the PLL. These delays may further translate into an increase in overall energy consumption, and in relation to mobile or portable electronic devices, a decrease in battery life. A need therefore exists for more efficient PLLs.

SUMMARY OF THE DISCLOSURE

In one aspect of the present disclosure, a method of operating a PLL upon startup is provided. In this aspect, the PLL includes at least a phase detector, a frequency divider and a local oscillator. The method includes receiving a clock reference signal, maintaining each of the phase detector and the frequency divider of the PLL in a disabled state, and enabling each of the phase detector and the frequency divider such that at least the frequency divider is in substantial synchronization with a significant edge, such as a rising or falling edge, of the clock reference signal.

In another aspect of the present disclosure, a method of synchronizing a PLL having at least a phase detector, a frequency divider and a local oscillator is provided. The method according to this aspect includes receiving a clock reference signal having a plurality of significant edges, receiving a reset signal, maintaining each of the phase detector and the frequency divider in reset in response to the reset signal, setting the local oscillator to a target frequency and the frequency divider to an initial scaling ratio, and enabling each of the phase detector and the frequency divider such that at least a feedback signal of the frequency divider is enabled in substantial synchronization with the next significant edge of the clock reference signal.

In yet another aspect of the present disclosure, a PLL is provided. The PLL in this aspect includes a local oscillator configured to generate an output signal, a feedback divider configured to generate a feedback signal in response to the output signal, a phase detector configured to operate the local oscillator based on a comparison between a reference signal and the feedback signal, and a reset controller in communication with each of the phase detector and the feedback divider. The reset controller is configured to hold each of the phase detector and the frequency divider in reset, and enable each of the phase detector and the frequency divider such that at least the feedback signal is in substantial synchronization with the reference signal.

DETAILED DESCRIPTION

Reference will now be made in detail to specific embodiments or features, examples of which are illustrated in the accompanying drawings. Generally, corresponding reference numbers will be used throughout the drawings to refer to the same or corresponding parts.

Figure 1:
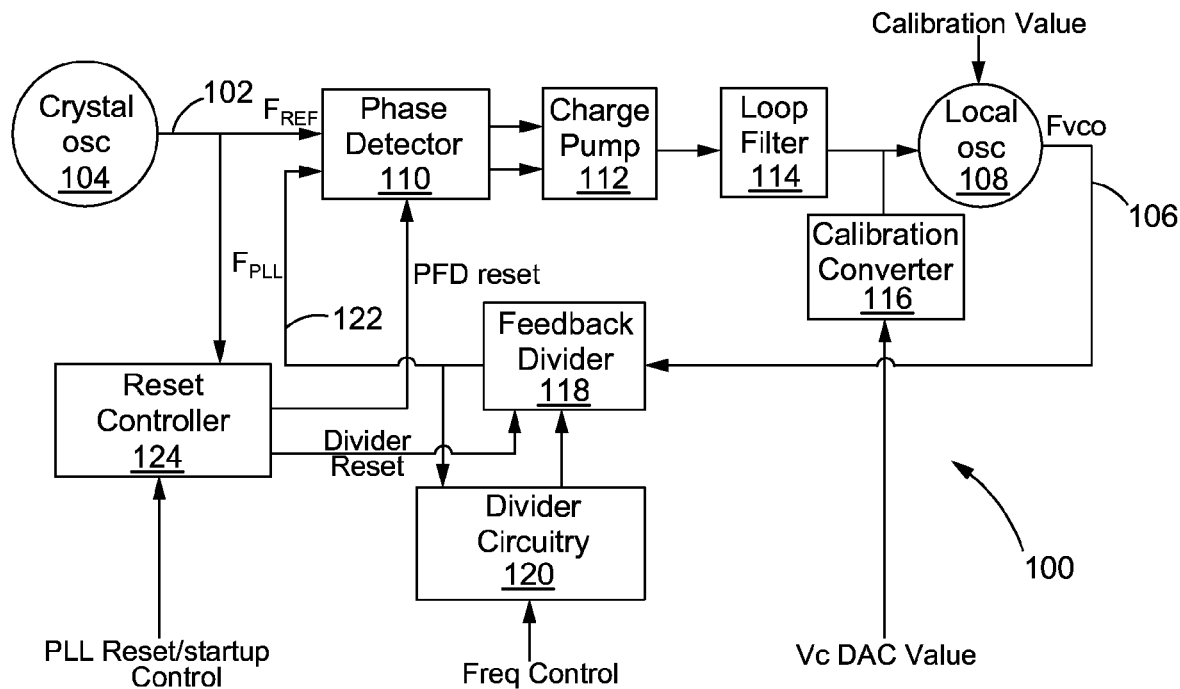
FIG. 1 is a schematic view of an example PLL device having a reset synchronization controller constructed in accordance with an aspect of the present disclosure.

Referring to FIG. 1, an example embodiment of a phase-locked loop (PLL) device 100 is disclosed which may be used to generate a stable output frequency based on a given reference frequency. More particularly, the PLL 100 is configured to detect the relative phase or frequency of a given clock or reference signal 102, such as provided by a crystal oscillator 104, or the like, and generate an output signal 106 which matches or otherwise relates to the detected phase or frequency of the reference signal 102. As shown, the PLL device 100 includes a local oscillator 108, a phase detector 110, a charge pump 112, a loop filter 114, a calibration converter 116, a feedback divider 118 and divider circuitry 120, among other basic circuitry, which form a feedback signal 122 in a feedback loop for monitoring the phase offset between the reference signal 102 and the output signal 106.

As shown, the output signal 106 is generated by a local oscillator 108, such as a voltage-controlled oscillator (VCO) or any other suitable oscillator having variable frequency output. The output signal 106 of the VCO 108 is fed back into an input of the phase detector 110 in the form of the feedback signal 122. The phase detector 110 additionally receives the reference signal 102 provided by the reference or crystal oscillator 104 at a second input thereof, and compares the phase of the reference signal 102 with the phase of the feedback signal 122. For example, the phase detector 110 can be configured to compare a significant edge, such as the rising or falling edge of the reference signal 102 relative to a significant edge of the feedback signal 122. Based on the comparison, the phase detector 110 can determine a phase offset, if any, and communicate a signal corresponding to the phase offset to the charge pump 112.

Based on the phase offset determined by the phase detector 110, the charge pump 112 is configured to generate a signal that is proportional to the phase offset and communicate the signal to the loop filter 114. In turn, the loop filter 114 generates a filtered voltage or current signal based on the output of the charge pump 112 configured to appropriately adjust the VCO 108 and compensate for any existing phase offset. For example, the signal ultimately generated by the phase detector 110, the charge pump 112 and the loop filter 114 causes the VCO 108 to increase the output frequency if the significant edge, such as the rising edge, of the reference signal 102 leads relative to that of the feedback signal 122, or decrease the output frequency if the significant edge of the reference signal 102 lags relative to that of the feedback signal 122, and thereby reduce any phase offset between the reference signal 102 and the output signal 106 generated by the PLL 100 per iteration or cycle.

Still referring to FIG. 1, the PLL device 100 additionally includes a calibration converter 116, provided in the form of a digital to analog converter (DAC), or the like, selectively coupled to the VCO 108 and capable of applying an initial condition to an input of the VCO 108 during calibration and startup. The PLL device 100 further includes a feedback divider 118 and related divider circuitry 120 disposed along the feedback loop in between the VCO 108 and the phase detector 110. The feedback divider 118 and divider circuitry 120 are configured to scale, such as down-divide, the frequency of the output signal 106 by appropriate ratios, thereby generating a feedback signal 122 to be input to the phase detector 110 and compared with the reference signal 102.

The PLL device 100 of FIG. 1 further includes a reset controller 124 in communication with the reference clock or oscillator 104 and operatively coupled to each of the phase detector 110 and feedback divider 118. The reset controller 124 operates during startup of the PLL 100 and selectively engages each of the phase detector 110 and the feedback divider 118 in a manner which prequalifies the output signal 106 provided by the VCO 108. For example, the reset controller 124 is configured to simultaneously maintain at least each of the phase detector 110 and the feedback divider 118 in a reset or a disabled state of operation during startup, monitor the clock or reference signal 102, and release or enable each of the phase detector 110 and the feedback divider 118 in substantial synchronization with the next anticipated and enabling clock cycle.

The PLL device 100 of FIG. 1, or at least the reset controller 124 thereof, is configured to perform synchronization according to a predetermined set of instructions, algorithms, coded processes, or the like. One such exemplary algorithm or method 126 for synchronizing the PLL device 100 is diagrammatically provided in FIG. 2. As shown in block 126-1, the reset controller 124 is initially configured to standby for any instruction to the PLL 100 to startup, calibrate, or otherwise reset the PLL 100. When such an instruction to startup, calibrate or otherwise reset the PLL 100 is detected, such as by a reset signal, or the like, the reset controller 124 in block 126-2 is configured to simultaneously disable or hold each of at least the phase detector 110 and the feedback divider 118 in a reset state.

While the reset controller 124 holds each of the phase detector 110 and the feedback divider 118 in reset, one or more other parameters of the PLL device 100 are set in block 126-3. For example, the local oscillator or VCO 108 is calibrated or set to a predefined target frequency, and the divider circuitry 120 of the feedback divider 118 is set to a predefined initial scaling or dividing ratio. In block 126-4, the reset controller 124 further monitors the clock or reference signal 102 for the next clock cycle with which the VCO 108 should be synchronized. Once the next enabling clock cycle is available, the reset controller 124 in block 126-5 is configured to release each of the phase detector 110 and the feedback divider 118 such that the first defining or significant edge of the feedback signal 122 that is output by the feedback divider 118 is in substantial synchronization with that of the reference signal 102 as seen by at least the phase detector 110.

Figure 3:
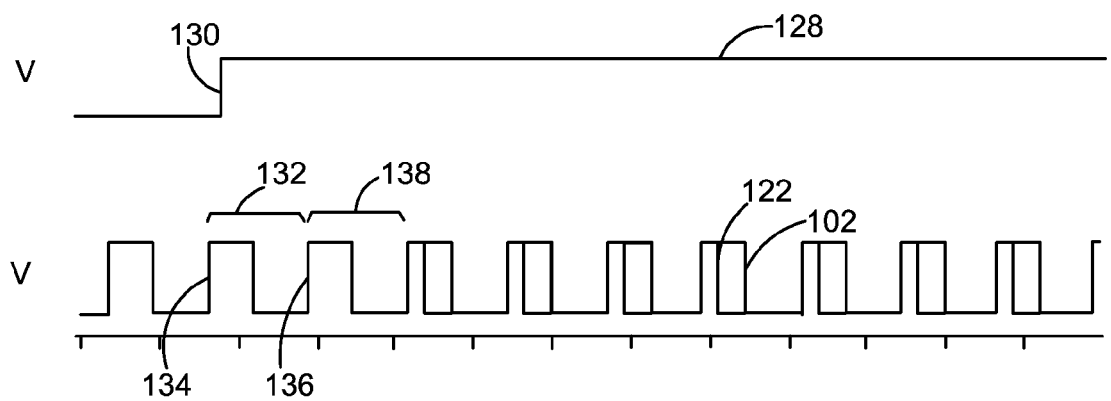
FIG. 3 is a graphical view illustrating a phase-matching process of a PLL employing a reset synchronization controller during startup in accordance with an aspect of the present disclosure.
Figure 2:
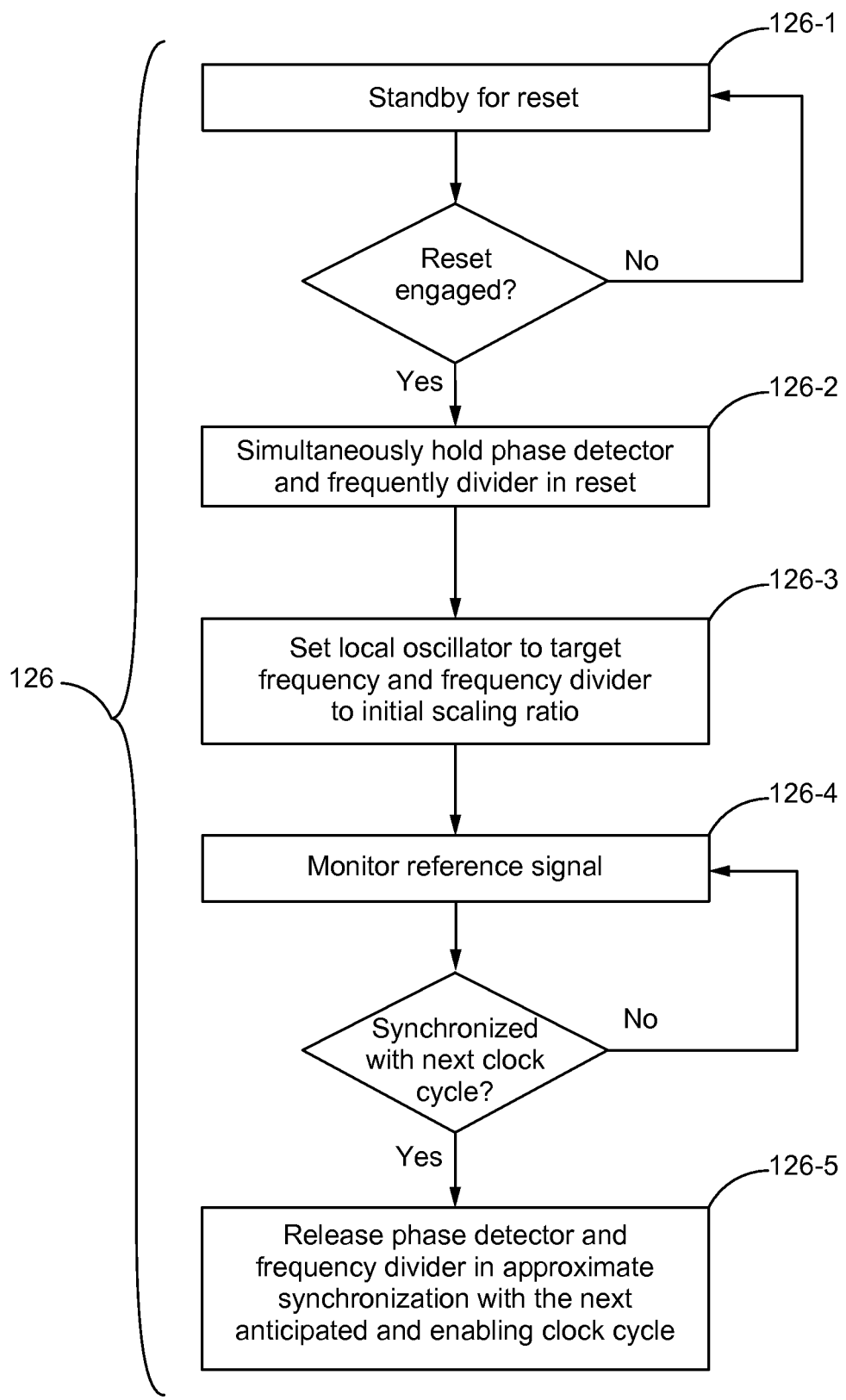
FIG. 2 is a flow diagram showing an example method of controlling a PLL during startup in accordance with an aspect of the present disclosure.

As graphically illustrated in FIG. 3, the reset signal 128 represents the non-synchronized initial startup, calibrate or otherwise reset instruction according to which the reset controller 124 operates in FIG. 2. As shown, for example, the reset signal 128 is initially disabled or in a logical LOW state during which the reset controller 124 holds each of the phase detector 110 and the feedback divider 118 in reset according to block 126-2 of FIG. 2, and during which other local parameters of the PLL 100 can be calibrated or initialized as in block 126-3. Additionally, the reset controller 124 monitors the reference signal 102 for the next enabling clock cycle in the reference signal 102 with which at least the feedback divider 118 should be synchronized as in block 126-4. Once the reset signal 128 is released or cleared and set to a logical HIGH, for example, at the significant edge 130 thereof, the reset controller 124 enables each of the phase detector 110 and the feedback divider 118 as in block 126-5.

In correspondence with block 126-5 of the method 126 of FIG. 2, as the reset controller 124 was first engaged in the middle of the second cycle 132 of the reference signal 102 shown and after the significant edge 134 thereof, the reset controller 124 is configured to release the phase detector 110 and the feedback divider 118 from reset at the significant edge 136 of the next anticipated or third cycle 138 of the reference signal 102 shown. As shown, the phase of the resulting feedback signal 122 is substantially synchronized with that of the reference signal 102 almost immediately upon release of the feedback divider 118. Furthermore, as shown by the lock signal 140 as sampled from the phase detector 110, a phase-lock is achieved between the feedback signal 122 and the reference signal 102 approximately within one clock cycle of the release. Moreover, by approximating the phase of the reference signal 102 prior to releasing the feedback signal 122, the reset controller 124 is able to reduce the initial phase offset, and thereby reduce the overall time allotted to achieve phase-lock during startup, calibration or other reset functions.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A method of operating a phase-locked loop (PLL) upon startup, the PLL having at least a phase detector and a frequency divider, the method comprising:
   receiving a clock reference signal having a significant edge;
   maintaining each of the phase detector and the frequency divider of the PLL in a disabled state in response to a non-synchronized reset signal; and
   enabling each of the phase detector and the frequency divider such that at least the frequency divider is in substantial synchronization with the significant edge of the clock reference signal.

2. The method of claim 1, wherein each of the phase detector and the frequency divider is enabled such that a significant edge of a resulting feedback signal is substantially synchronized with a next significant edge of the clock reference signal.

3. The method of claim 1, wherein each of the phase detector and the frequency divider is maintained in reset in response to the non-synchronized reset signal.

4. The method of claim 1, wherein enabling the frequency divider generates a feedback signal having a frequency proportional to an output frequency of a local oscillator of the PLL, and wherein enabling the phase detector causes the phase detector to determine a phase difference between the clock reference signal and the feedback signal and to adjust the output frequency of the local oscillator to correct the phase difference.

5. The method of claim 4, wherein the frequency divider generates the feedback signal by down-dividing the output frequency of the local oscillator by a predefined ratio.

6. The method of claim 1, wherein a local oscillator of the PLL is initially set to a target frequency and the frequency divider is set to an initial scaling ratio while each of the phase detector and the frequency divider is maintained in the disabled state.

7. A method of synchronizing a phase-locked loop (PLL) having at least a phase detector, a frequency divider and a local oscillator, the method comprising:
receiving a clock reference signal having a plurality of significant edges;
receiving a non-synchronized reset signal;
maintaining each of the phase detector and the frequency divider in reset in response to the non-synchronized reset signal;
setting the local oscillator to a target frequency and the frequency divider to an initial scaling ratio; and
enabling each of the phase detector and the frequency divider such that at least a feedback signal of the frequency divider is enabled in substantial synchronization with the next significant edge of the clock reference signal.

8. The method of claim 7, wherein each of the phase detector and the frequency divider is disabled while in reset.

9. The method of claim 7, wherein the local oscillator is a voltage-controlled oscillator and the target frequency is set using a calibration digital to analog converter.

10. The method of claim 7, wherein each significant edge is one of a rising edge and a falling edge.

11. The method of claim 7, wherein enabling the frequency divider generates the feedback signal to have a frequency proportional to an output frequency of the local oscillator, and enabling the phase detector causes the phase detector to determine a phase difference between the clock reference signal and the feedback signal, and adjust the output frequency of the local oscillator to correct the phase difference.

12. The method of claim 11, wherein the frequency divider generates the feedback signal by down-dividing the output frequency of the local oscillator by a predefined ratio.

13. A phase-locked loop (PLL), comprising:
a local oscillator configured to generate an output signal;
a feedback divider configured to generate a feedback signal in response to the output signal;
a phase detector configured to operate the local oscillator based on a comparison between a reference signal and the feedback signal; and
a reset controller in communication with each of the phase detector and the feedback divider, the reset controller being configured to hold each of the phase detector and the frequency divider in reset in response to a non-synchronized reset signal, and enable each of the phase detector and the frequency divider such that at least the feedback signal is in substantial synchronization with the reference signal.

14. The PLL of claim 13, wherein each of the phase detector and the frequency divider is disabled while in reset.

15. The PLL of claim 13, wherein the reset controller is configured to enable each of the phase detector and the frequency divider such that a significant edge of at least the feedback signal is in substantial synchronization with a significant edge of the reference signal.

16. The PLL of claim 13, wherein the reset controller is configured to enable each of the phase detector and the frequency divider such that a significant edge of at least the feedback signal is in substantially synchronization with a significant edge of the reference signal.

17. The PLL of claim 13, wherein the frequency divider is configured to down-divide an output frequency of the output signal by a predefined ratio.

18. The PLL of claim 13, wherein the phase detector is configured to determine a phase difference between the feedback signal and the reference signal and to adjust an output frequency of the local oscillator to correct the phase difference.

19. The PLL of claim 13, wherein the local oscillator is a voltage-controlled oscillator, the PLL further comprising a calibration digital to analog converter configured to set the local oscillator to the target frequency, a charge pump and a loop filter in communication between the phase detector and the local oscillator.

20. The PLL of claim 13, wherein the local oscillator is initially set to a target frequency and the frequency divider is set to an initial scaling ratio while the reset controller holds each of the phase detector and the frequency divider in reset.

* * * * *